(12) United States Patent
Liu

(10) Patent No.: US 7,298,044 B2
(45) Date of Patent: Nov. 20, 2007

(54) ELECTRONIC DEVICE WITH HEAT DISSIPATION MODULE

(75) Inventor: Hsiang-Chao Liu, Tao Yuan Shien (TW)

(73) Assignee: Quanta Computer Inc., Tao Yuan Shien (TW)

( * ) Notice: Subject to any disclaimer, the term of this patent is extended or adjusted under 35 U.S.C. 154(b) by 143 days.

(21) Appl. No.: 11/230,830

(22) Filed: Sep. 20, 2005

(65) Prior Publication Data

US 2006/0244129 A1 Nov. 2, 2006

(30) Foreign Application Priority Data

Apr. 28, 2005 (TW) .............................. 94113662 A

(51) Int. Cl.
*H01L 23/34* (2006.01)

(52) U.S. Cl. .................. 257/720; 257/713; 257/719; 257/E23.088; 257/E23.101

(58) Field of Classification Search ................ 257/720, 257/E23.088

See application file for complete search history.

(56) References Cited

U.S. PATENT DOCUMENTS

| 5,136,152 | A | * | 8/1992 | Lee ............................. 257/699 |
| 5,857,761 | A | * | 1/1999 | Abe et al. ................... 362/551 |
| 6,351,610 | B1 | * | 2/2002 | Numako et al. ............ 396/180 |
| 6,789,921 | B1 | * | 9/2004 | Deloy et al. ................ 362/252 |
| 2002/0121097 | A1 | * | 9/2002 | Chiu et al. ..................... 62/3.7 |
| 2004/0136163 | A1 | * | 7/2004 | Horng et al. ............... 361/719 |
| 2005/0066103 | A1 | * | 3/2005 | Shinozaki ................... 710/301 |
| 2005/0146850 | A1 | * | 7/2005 | Meir .......................... 361/687 |

* cited by examiner

*Primary Examiner*—Tu-Tu Ho
(74) *Attorney, Agent, or Firm*—Thomas, Kayden, Horstemeyer & Risley

(57) ABSTRACT

An electronic device. The electronic device includes a circuit board, a heat dissipation module, and a light-emitting diode. The circuit board includes a heating element thereon. The heat dissipation module is disposed on the circuit board and the heating element. The light-emitting diode is disposed on the heat dissipation module. The heat dissipation module is connected to the heating element and the light-emitting diode.

19 Claims, 3 Drawing Sheets

ELECTRONIC DEVICE WITH HEAT DISSIPATION MODULE

BACKGROUND

The invention relates to an electronic device with a heat dissipation module, and in particular, to an electronic device with a heat dissipation module for light-emitting diodes.

The typical backlight source of a conventional liquid crystal display is a cold cathode fluorescent lamp (CCFL). Although the cold cathode fluorescent lamps are excellent for linear light-emitting and uniform light sources, they suffer from redundant power consumption and damage environment. Compared with cold cathode fluorescent lamps, a light-emitting diode uses a point light source, has low power-consumption, long life-span, miniaturization, and environmental protection. Light-emitting diodes are gradually replacing cold cathode fluorescent lamps. Thus, light-emitting diodes are often employed in the liquid crystal displays of mobile phones, camera, and notebook computers.

High luminance of the light-emitting diodes, however, generates excessive heat. Thus, heat dissipation for light-emitting diodes is problematic in electronic devices. Heat dissipation modules are typically only designed for central processing units and chipsets, not light-emitting diodes.

SUMMARY

Electronic devices with a heat dissipation module are provided. Accordingly, an exemplary embodiment of an electronic device comprises a circuit board, a heat dissipation module, and a light-emitting diode. The circuit board comprises a heating element thereon. The heat dissipation module is disposed on the circuit board and the heating element. The light-emitting diode is disposed on the heat dissipation module. The heat dissipation module is connected to the heating element and the light-emitting diode simultaneously.

The heating element comprises a chipset or a central processing unit. The heat dissipation module comprises a heat pipe and a heat exchanger, and the light-emitting diode is disposed on the heat pipe. The heat dissipation module comprises a fan, which blows toward the heat exchanger and exhausts the heat on the heat exchanger. The heat exchanger has a plurality of fins, and the fan blows toward the fins and exhausts the heat on the fins.

The electronic device further comprises a light guiding element, connected to the light-emitting diode, transmitting light from the light emitting diode.

Note that the light guiding element is an optical fiber tube, a glass tube, or a plastic tube. The electronic device is a notebook computer with a liquid crystal display. The light guiding element transmits the light from the light-emitting diode as a backlight source of the liquid crystal display.

DESCRIPTION OF THE DRAWINGS

The invention can be more fully understood by reading the subsequent detailed description and examples with references made to the accompanying drawings, wherein.

DETAILED DESCRIPTION

Figure 1:
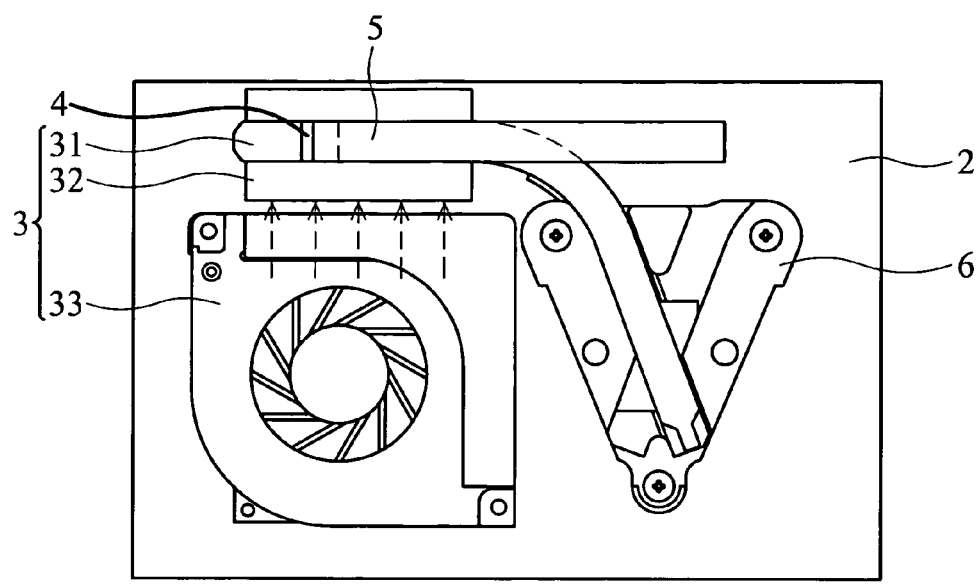
FIG. 1 is a schematic view of an embodiment of an electronic device with a heat dissipation module.

Referring to FIG. 1, an electronic device 1 with a heat dissipation module comprises a circuit board 2, a heat dissipation module 3, a light-emitting diode 4, and a light guiding element 5. The circuit board 2 comprises a central processing unit 6.

Figure 2:
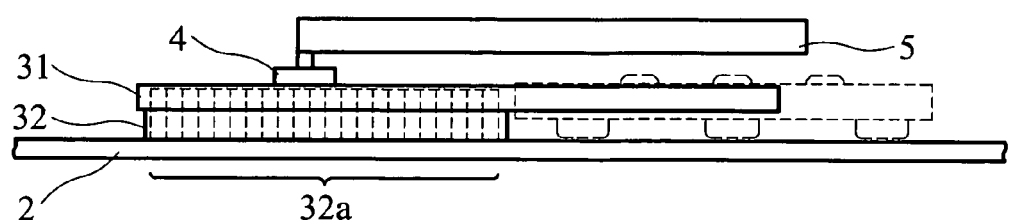
FIG. 2 is a side view of the electronic device in FIG. 1.

The heat dissipation module 3, disposed on the circuit board 2, connected to the central processing unit 6 (heating element), comprises a heat pipe 31, a heat exchanger 32, and a fan 33. Referring to FIG. 2, the heat exchanger 32 comprises a plurality of fins 32a thereon, and the light-emitting diode 4 is disposed on the heat pipe 31 of the heat dissipation module 3. When the light-emitting diode 4 emits light, heat is transmitted to the heat pipe 31 and the heat exchanger 32 sequentially. Further referring to FIG. 1 and FIG. 2, when heat is transmitted to the fins 32a of the heat exchanger 32, the fan 33 blows toward the fins 32a and exhausts heat from the fins 32a. Thus, heat on the light-emitting diode 4 is dissipated.

Figure 3:
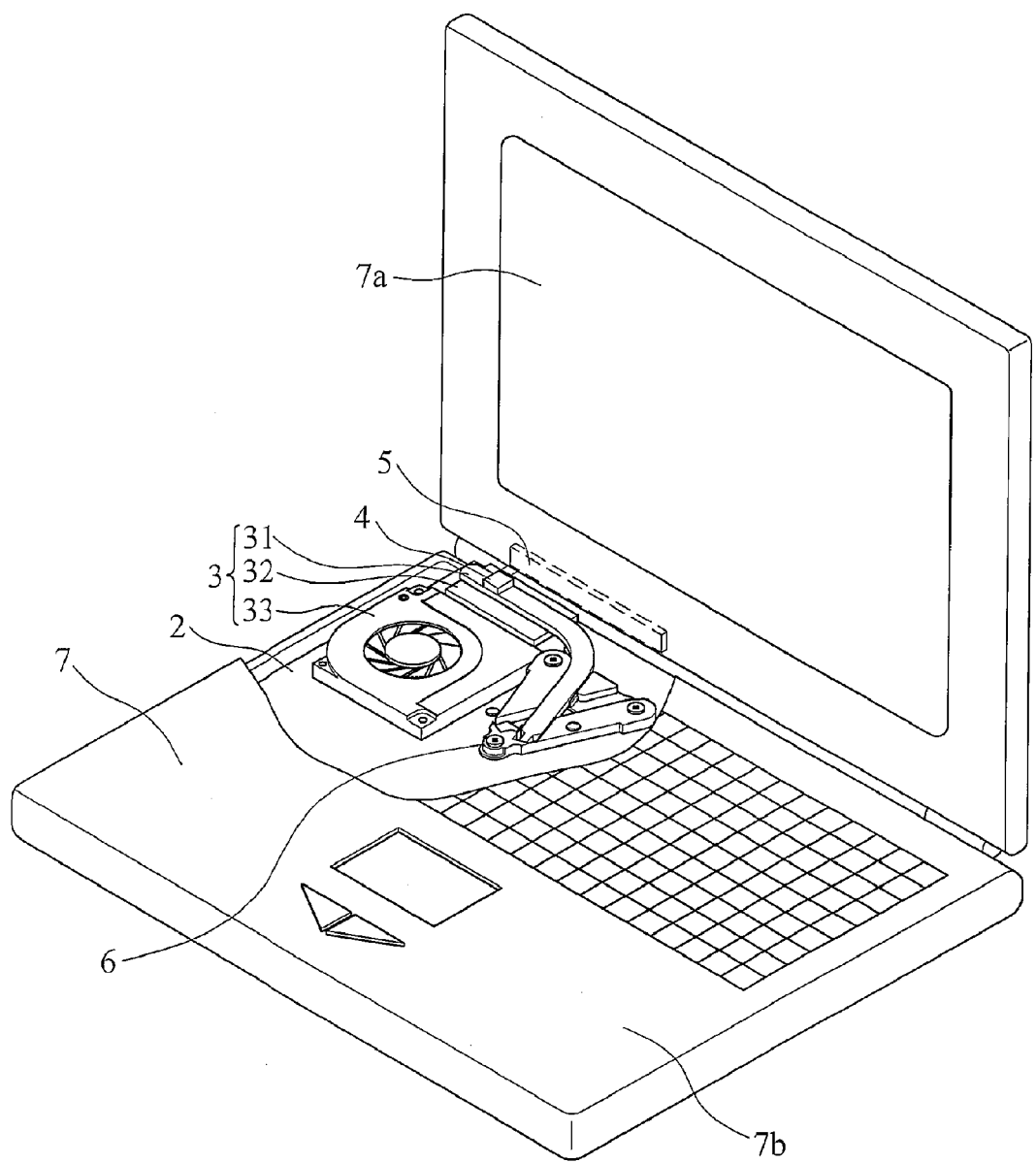
FIG. 3 is a schematic view of a notebook computer employing the heat dissipation module in FIG. 1.

Additionally, referring to FIG. 2, the light-emitting diode 4 is connected to the light guiding element 5. The light guiding element 5 can transmit light from the light-emitting diode 4 for providing the use of the electronic device 1. As shown in FIG. 3, the electronic device 1 can be a notebook computer 7 with a body 7b and a liquid crystal display 7a disposed on the body 7b. Referring to FIG. 3, the circuit board 2 and the light-emitting diode 4 are disposed in the body 7b, and the light guiding element 5 is disposed in the liquid crystal display 7a. Referring to FIG. 2 and FIG. 3, light from the light-emitting diode 4 can be transmitted through the light guiding element 5 to the liquid crystal display 7a, providing liquid crystal display 7a as a backlight source. The light guiding element 5 can be an optical fiber tube, a glass tube, or a plastic tube.

When the electronic device 1 is used, light is provided by the light-emitting diode 4 through the light guiding element 5, to serve as a backlight source for the liquid crystal display 7a. Because a large amount of heat is produced by the light-emitting diode 4, the light-emitting diode 4 is disposed on the heat pipe 31 of the heat dissipation module 3, which can rapidly transmit heat to the heat pipe 31. Furthermore, heat is transmitted to the heat exchanger 32 through the heat pipe 31. The fins 32a of the heat exchanger 32 can increase heat dissipation area, and airflow generated by the fan 33 exhausts heat from the fins 32a.

Note that the heat dissipation module 3 of the present invention is not limited to that depicted in FIG. 1, which comprise a fan 33. The heat dissipation module 3 may not comprise a fan 33, and may only comprise the heat pipe 31 and the heat exchanger 32.

Furthermore, the heat dissipation module 3 of the present invention is not limited to that depicted in FIG. 2, in which the module is disposed on the heat pipe 31. The heat dissipation module 3 can also be disposed on the heat exchanger 32.

Additionally, the electronic device 1 of the present invention is not limited to the notebook computer 7 depicted in FIG. 3. The electronic device 1 can be any electronic device requiring liquid crystal displays.

Figure 4:
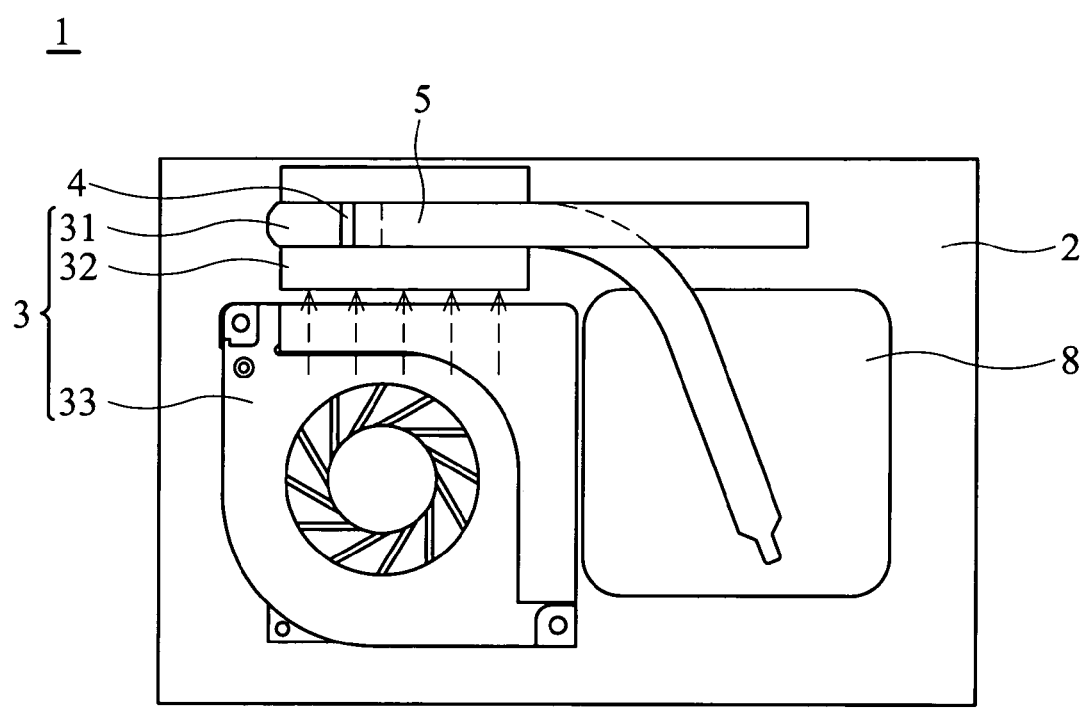
FIG. 4 is a schematic view of another embodiment of an electronic device with a heat dissipation module.

Note that the heat dissipation module 3 is not limited to being disposed on the central processing unit depicted in FIG. 1. The heat dissipation module 3 can be disposed on any heating element on the circuit board 2. For example, the heat dissipation module can be disposed on the chipset 8 as shown in FIG. 4.

While the invention has been described by way of example and in terms of the preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, comprising:
   a circuit board comprising a heating element;
   a heat dissipation module, comprising a heat pipe and a heat exchanger, disposed on the circuit board and the heating element; and
   a light-emitting diode disposed on the heat pipe of the heat dissipation module, wherein the heat dissipation module directly contacts the heating element and the light-emitting diode.

2. The electronic device as claimed in claim 1, wherein the heating element comprises a chipset.

3. The electronic device as claimed in claim 1, wherein the heat dissipation module further comprises a fan, blowing toward the heat exchanger and exhausting the heat from the heat exchanger.

4. The electronic device as claimed in claim 3, wherein the heat exchanger comprises a plurality of fins, and the fan blowing towards the fins and exhausts the heat from the fins.

5. The electronic device as claimed in claim 1, further comprising a light guiding element, connected to the light-emitting diode and transmitting light from the light-emitting diode.

6. The electronic device as claimed in claim 5, wherein the light guiding element is an optical fiber tube.

7. The electronic device as claimed in claim 5, wherein the light guiding element is a glass tube.

8. The electronic device as claimed in claim 5, wherein the light guiding element is a plastic tube.

9. The electronic device as claimed in claim 5, wherein the electronic device is a notebook computer with a liquid crystal display.

10. The electronic device as claimed in claim 9, wherein the light guiding element transmits light from the light-emitting diode serving as a backlight source of the liquid crystal display.

11. The electronic device as claimed in claim 1, wherein the heating element comprises a central processing unit.

12. A notebook computer, comprising:
    a body;
    a liquid crystal display disposed on the body;
    a circuit board, disposed in the body, comprising a heating element;
    a heat dissipation module disposed on the circuit board and the heating element;
    a light-emitting diode disposed on the heat dissipation module, wherein the heat dissipation module connects the heating element and the light-emitting diode; and
    a light guiding element, disposed in the liquid crystal display, connected to the light-emitting diode and transmitting light from the light-emitting diode.

13. The notebook computer as claimed in claim 12, wherein the light-emitting diode is disposed in the body.

14. The notebook computer as claimed in claim 12, wherein the heating element comprises a central processing unit.

15. The notebook computer as claimed in claim 12, wherein the heating element comprises a chip.

16. The notebook computer as claimed in claim 12, wherein the heat dissipation module comprises a heat pipe and a heat exchanger, and the light-emitting diode is disposed on the heat pipe.

17. The notebook computer as claimed in claim 16, wherein the heat dissipation module further comprises a fan, blowing toward the heat exchanger and exhausting the heat from the heat exchanger.

18. The notebook computer as claimed in claim 12, wherein the light guiding element transmits light from the light-emitting diode serving as a backlight source of the liquid crystal display.

19. A notebook computer with a liquid crystal display, comprising:
    a circuit board comprising a heating element;
    a heat dissipation module disposed on the circuit board and the heating element;
    a light-emitting diode disposed on the heat dissipation module, wherein the heat dissipation module directly contacts the heating element and the light-emitting diode; and
    a light guiding element, connected to the light-emitting diode and transmitting light from the light-emitting diode.

* * * * *